(12) United States Patent
Fukasawa et al.

(10) Patent No.: US 9,329,221 B2
(45) Date of Patent: May 3, 2016

(54) PARTIAL DISCHARGE SENSOR

(75) Inventors: Toru Fukasawa, Tokyo (JP); Hiroaki Miyashita, Tokyo (JP); Takashi Itoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 308 days.

(21) Appl. No.: 13/881,551

(22) PCT Filed: Apr. 6, 2011

(86) PCT No.: PCT/JP2011/002047
§ 371 (c)(1),
(2), (4) Date: Apr. 25, 2013

(87) PCT Pub. No.: WO2012/137254
PCT Pub. Date: Oct. 11, 2012

(65) Prior Publication Data
US 2014/0002099 A1    Jan. 2, 2014

(51) Int. Cl.
*G01R 31/02* (2006.01)
*G01R 31/12* (2006.01)
*H02B 13/065* (2006.01)
*G01R 29/08* (2006.01)

(52) U.S. Cl.
CPC .......... *G01R 31/021* (2013.01); *G01R 31/1254* (2013.01); *G01R 31/1272* (2013.01); *G01R 29/0878* (2013.01); *H02B 13/0655* (2013.01)

(58) Field of Classification Search
CPC .......... G01R 31/1254; G01R 31/1272; G01R 29/0878; H02B 13/0655
See application file for complete search history.

(56) References Cited

U.S. PATENT DOCUMENTS

| | | | |
|---|---|---|---|
| 5,804,972 A * | 9/1998 | de Kock et al. | 324/536 |
| 6,307,381 B1 | 10/2001 | Dalichau et al. | |
| 6,333,715 B1 * | 12/2001 | Kato et al. | 343/701 |
| 2005/0184737 A1 | 8/2005 | Moriyama et al. | |
| 2005/0285604 A1 | 12/2005 | Shinohara et al. | |
| 2006/0071667 A1 | 4/2006 | Moriyama et al. | |
| 2006/0164100 A1 | 7/2006 | Moriyama et al. | |
| 2007/0139056 A1 * | 6/2007 | Kaneiwa | G01R 31/1227 324/536 |
| 2009/0027062 A1 * | 1/2009 | Maruyama et al. | 324/544 |
| 2010/0123464 A1 * | 5/2010 | Park et al. | 324/500 |
| 2010/0134957 A1 * | 6/2010 | Tsurimoto | H02G 5/065 361/612 |

FOREIGN PATENT DOCUMENTS

| | | |
|---|---|---|
| JP | 4 204065 | 7/1992 |
| JP | 5-76122 | 3/1993 |
| JP | 2001 516449 | 9/2001 |

(Continued)

OTHER PUBLICATIONS

International Search Report Issued Jul. 12, 2011 in PCT/JP11/02047 Filed Apr. 6, 2011.

(Continued)

*Primary Examiner* — Tung X Nguyen
*Assistant Examiner* — Adam Clarke
(74) *Attorney, Agent, or Firm* — Oblon, McClelland, Maier & Neustadt, L.L.P.

(57) ABSTRACT

A partial discharge sensor includes a top-loading monopole antenna including a disc and a post to be installed even in a branch pipe with a small diameter such that a length between the disc and a structure is adjusted to set thereto a frequency band to be detected.

3 Claims, 10 Drawing Sheets

(56) References Cited

FOREIGN PATENT DOCUMENTS

| | | |
|---|---|---|
| JP | 2005 233837 | 9/2005 |
| JP | 2006 47285 | 2/2006 |
| JP | 2009 20008 | 1/2009 |
| JP | 2009 174894 | 8/2009 |

OTHER PUBLICATIONS

Notice of Reason for Rejection issued Feb. 4, 2014 in Japanese Patent Application No. 2013-508628 (with partial English translation).

* cited by examiner

PARTIAL DISCHARGE SENSOR

TECHNICAL FIELD

The present invention relates to a partial discharge sensor for detecting a partial discharge phenomenon in a high-power equipment such as GIS (Gas Insulated Switch) by detecting a radio-frequency wave generated in such an apparatus.

BACKGROUND ART

As a conventional technique, a bowl-shaped recess is formed in a cylindrical structure arranged to surround a high voltage cable, and a partial discharge sensor formed in an inverted cone shape is arranged in the bowl-shaped recess (see Patent Document 1).

In order to detect a partial discharge within a GIS, in general, a sensor is required to receive broadband radio-frequency waves of 500 MHz to 1500 MHz generated during the partial discharge.

On the other hand, when an inverted cone shaped antenna is arranged on a planar ground, similar characteristics to those of a disk cone antenna having broadband characteristics can be obtained.

In the conventional partial discharge sensor, a place of the cylindrical structure where the inverted cone shaped partial discharge sensor is to be arranged is formed in a bowl shape, and a surface of the structure is set to a ground potential to be thus approximated to a planar ground, and therefore similar broadband characteristics to those of a disk cone antenna are obtained. prevented.

PRIOR ART DOCUMENTS

Patent Documents

Patent Document 1: Japanese Translation of PCT Application No. 2001-516449

SUMMARY OF THE INVENTION

Problems to be Solved by the Invention

Since the conventional partial discharge sensor is configured as described above, the bowl-shaped portion where the partial discharge sensor is to be arranged must be formed in a large dimension.

This is because the partial discharge sensor of the inverted cone shape is required to have a diameter of the order of a half wavelength of a minimum frequency to be detected, and hence the inverted cone shape is required to have a diameter of about 250 mm in order to configure the partial discharge sensor coping with 500 to 1500 MHz.

Further, the bowl-shaped portion must be greater in size than the inverted cone shape, and hence it is required to prepare therein an opening of the order of at least 300 mm.

On the other hand, various cylindrical branch pipes are installed in a structure of the GIS beforehand. When it is possible to install the partial discharge sensor in the branch pipe, the partial discharge sensor can be added thereto without implementing a major construction to the installed GIS already installed.

However, since a narrow one of the cylindrical branch pipes has an inner diameter of the order of 70 mm, there is a problem such that the conventional partial discharge sensor cannot be installed therein.

The present invention is made in order to solve the aforementioned problem, and an object of the invention is to obtain a partial discharge sensor that can be installed in a branch pipe with a small diameter.

Means for Solving the Problems

A partial discharge sensor of the invention includes: a disc which is arranged in an interior of a branch pipe and of which one surface is substantially flush with an inner surface of a structure; a post connected to the other surface of the disc; and a cover member which has an opening to be inserted into by the post at a center thereof, and of which one surface is arranged to cover the other end of the branch pipe to be thus electrically connected with the structure through the branch pipe; and a short-circuit plate or a short-circuit line having an electrical length of ¼ wavelength of a specific frequency included in a frequency band to be detected, and connecting the cover member with a portion of the post in a vicinity of the cover member.

Effect of the Invention

According to the invention, a top-loading monopole antenna is constituted by the disc and post. Thus, it is possible to set thereto a frequency band to be detected without increasing an inner diameter of the branch pipe in such a manner that a distance between the cylindrical structure and the disc is adjusted; therefore, there is an advantageous effect such that the partial discharge sensor that can be installed even in the branch pipe with a small diameter can be obtained.

Also, since the top-loading monopole antenna has a shape that is axisymmetric about a central axis of the post, sensitivity on the one surface of the disc 6 has no angular characteristics in an azimuth direction thereof. Thus, there is an advantageous effect such that a radio-frequency wave arising within the cylindrical structure can be received at a fixed sensitivity in all the directions.

Further, a coaxial line is constituted by the cylindrical branch pipe, the post connected to the disc, and the cover member inserted thereinto by the post and electrically connected with the structure through the branch pipe. Thus, there is an advantageous effect such that a mixture by a radio-frequency noise coming from the outside of the branch pipe can be prevented at the time when the radio-frequency wave received by the disc is transmitted as a radio-frequency signal to the outside through the post.

Further, since there is a configuration having the discharge sensor in the inside of the branch pipe, there is an advantageous effect such that the partial discharge sensor can be added to an apparatus that has been already provided with the branch pipe without implementing a major construction to the apparatus.

Furthermore, when there is no vacancy in the branch pipes, a function of the partial discharge sensor of the present invention can be added to a conventional function with respect to the singe branch pipe, thereby achieving the single branch pipe having multiple functions. In this case, the necessity of providing a new branch pipe for only the partial discharge sensor is eliminated, and hence degree of freedom in design regarding the branch pipe can be enhanced.

BEST MODE FOR CARRYING OUT THE INVENTION

In the following, in order to explain the present invention in more detail, embodiments for carrying out the invention will be described with reference to the accompanying drawings.
Embodiment 1.

In Embodiment 1, it is configured that when a top-loading monopole antenna is provided within a branch pipe of a GIS, a partial discharge sensor can be installed even in a branch pipe with a small diameter.

Figure 1:
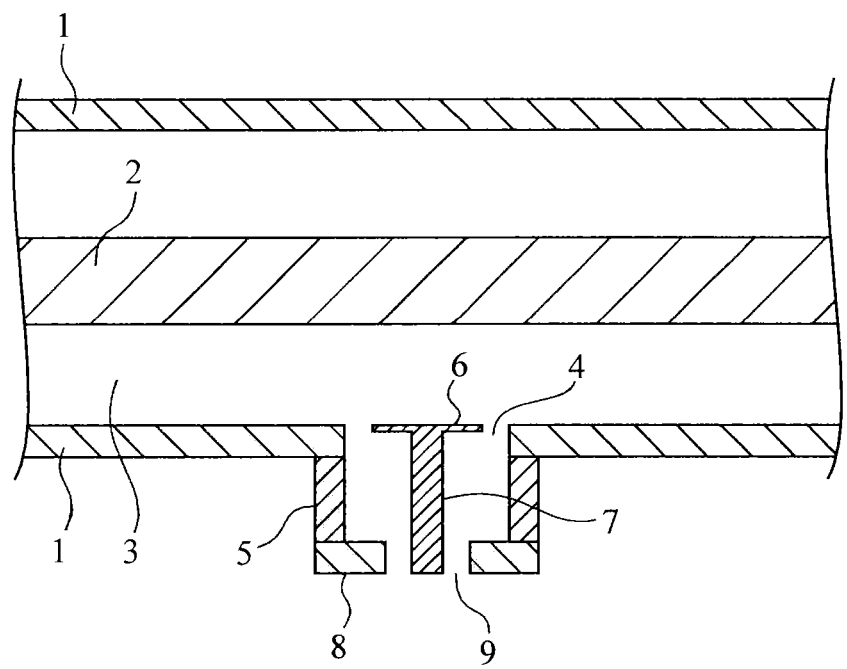
FIG. 1 is a cross-sectional view schematically showing a partial discharge sensor provided in a GIS according to Embodiment 1 of the present invention.
Figure 2:
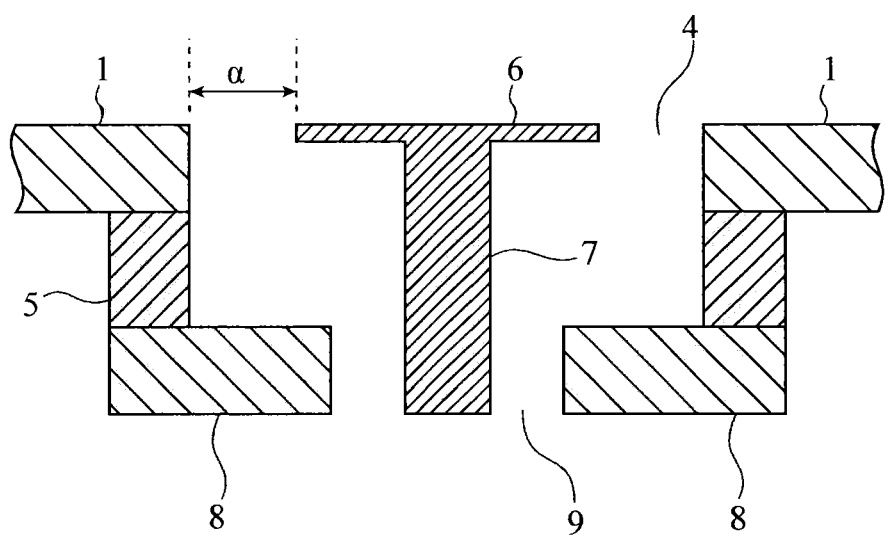
FIG. 2 is a cross-sectional view showing details of the partial discharge sensor according to Embodiment 1 of the invention.
Figure 3:
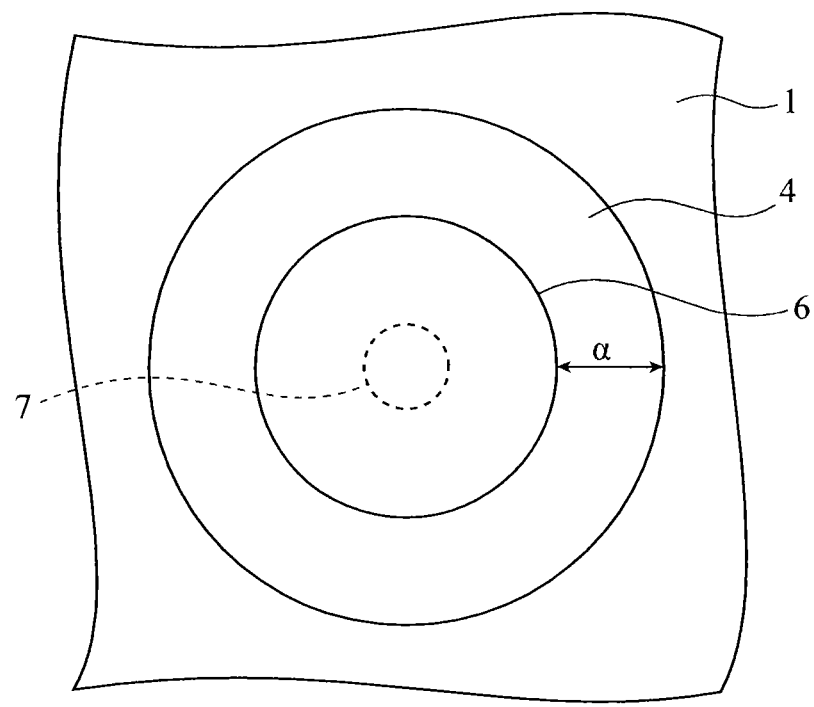
FIG. 3 is a top view showing details of the partial discharge sensor according to Embodiment 1 of the invention.

FIG. 1 is a cross-sectional view schematically showing a partial discharge sensor provided in the GIS according to Embodiment 1 of the invention, FIG. 2 is a cross-sectional view showing details thereof, and FIG. 3 is a top view showing details thereof.

In the drawings, a structure 1 has a cylindrical closed space 3 constructed to surround a high voltage cable 2. Also, the surface of the structure 1 is set to a ground potential, and the closed space 3 is filled with an insulating gas.

An opening 4 is a circular hole formed in the structure 1.

A branch pipe 5 which is formed in a cylindrical shape, and of which one end of the pipe is connected to the structure 1 such that an inner surface thereof coincides with that of the opening 4 of the structure 1. It is noted that an inner diameter of the branch pipe 5 is the same as a diameter of the opening 4.

A disc 6 is formed in a planar shape and arranged in the opening 4 of the structure 1 inside the branch pipe 5. Also, the disc 6 is arranged such that one surface of the disc is substantially flush with (substantially the same plane as) the inner surface of the structure 1, that is, the opening 4.

One end face of a post 7 is connected to the other surface of the disc.

A cover member 8 is provided with an opening 9 to be inserted into by the post 7 at the center thereof.

The opening 9 is a circular hole formed with a diameter greater than that of the post 7.

Also, the post 7 is inserted into the opening 9, so that the cover member 8 exposes the other end face of the post 7 to the outside space. Further, the cover member 8 is arranged such that one surface of the member covers the other end of the branch pipe 5 to be electrically connected to the structure 1 through the branch pipe 5. Similarly to the structure 1, the cover member 8 is set to the ground potential.

Next, an operation thereof will be described.

The GIS shown in FIG. 1 is adapted to open and close the high voltage cable 2 by a breaker.

A closed space 3 of the structure 1 is filled with an insulating gas; when a high voltage is applied to the high voltage cable 2, a partial discharge may occur between the high voltage cable 2 and the structure 1 set to the ground potential.

When the partial discharge occurs, a radio-frequency wave is generated in response to the said partial discharge.

The partial discharge sensor receives the radio-frequency wave at the disc 6, and transmits the wave as a radio-frequency signal to the outside through the post 7. In the outside, a measuring device detects the occurrence of the partial discharge within the structure 1 in response to reception of the radio-frequency signal.

Here, a principle of the partial discharge sensor will be described in more detail with reference to detailed drawings of the partial discharge sensor shown in FIGS. 2 and 3.

A configuration composed of the disc 6 and post 7 as shown in FIGS. 2 and 3 serves as the top-loading monopole antenna that is formed on the cover member 8 set to the ground potential.

The top-loading monopole exhibits a high performance when an impedance between the post 7 and the cover member 8 in the opening 9 is put in series resonance.

For example, in a case where a diameter of the disc 6 is reduced and a distance α between an outer peripheral surface of the disc 6 and an inner surface of the structure 1 forming the opening 4 is sufficiently large, a dimension of approximately $\lambda/2$ is required for the diameter of the disc 6 when a wavelength at a specific frequency to be detected is denoted by $\lambda$. Thus, when the specific frequency is set to 1000 MHz, the diameter of the disc 6 is required to have the dimension of 150 mm in order to cause the disc 6 to resonate at 1000 MHz.

In contrast, in a case where the diameter of the disc 6 is increased and the distance α between the outer peripheral surface of the disc 6 and the inner surface of the structure 1 forming the opening 4 is small, a stray capacitance is generated between the disc 6 and the structure 1.

As a result, it operates as a resonator with a capacitance loaded at the end of the disc 6, and hence the resonance is obtained with the diameter of the disc 6 having the dimension smaller than λ/2.

In principle, the diameter of the disc 6 can be made extremely small in such a manner that the distance α between the outer peripheral surface of the disc 6 and the inner surface of the structure 1 forming the opening 4 is reduced to thus increase the stray capacitance.

Paradoxically, the resonance frequency can be made smaller as the distance α between the outer peripheral surface of the disc 6 and the inner surface of the structure 1 forming the opening 4 is made smaller, and hence a frequency band or a specific frequency to be detected can be set lower without enlarging the diameter of the opening 4, that is, the inner diameter of the branch pipe 5 and/or the diameter of the disc 6.

Figure 4:
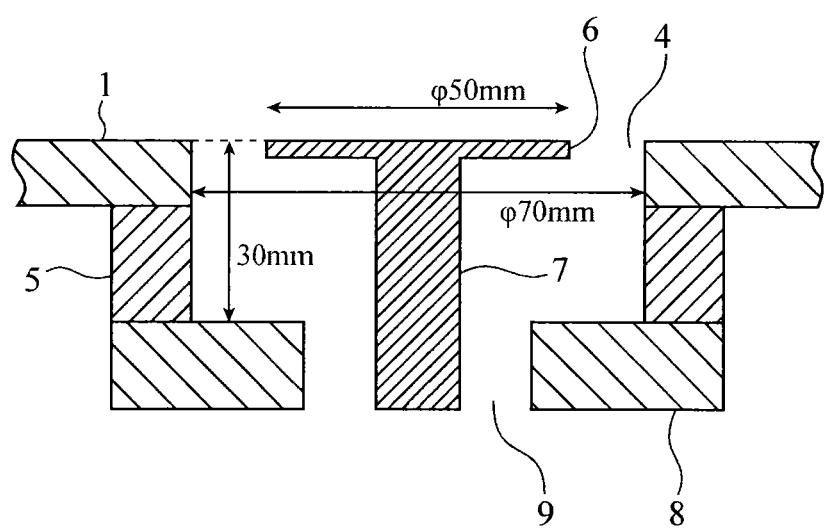
FIG. 4 is a cross-sectional view showing a computation model of a top-loading monopole antenna according to Embodiment 1 of the invention.
Figure 5:
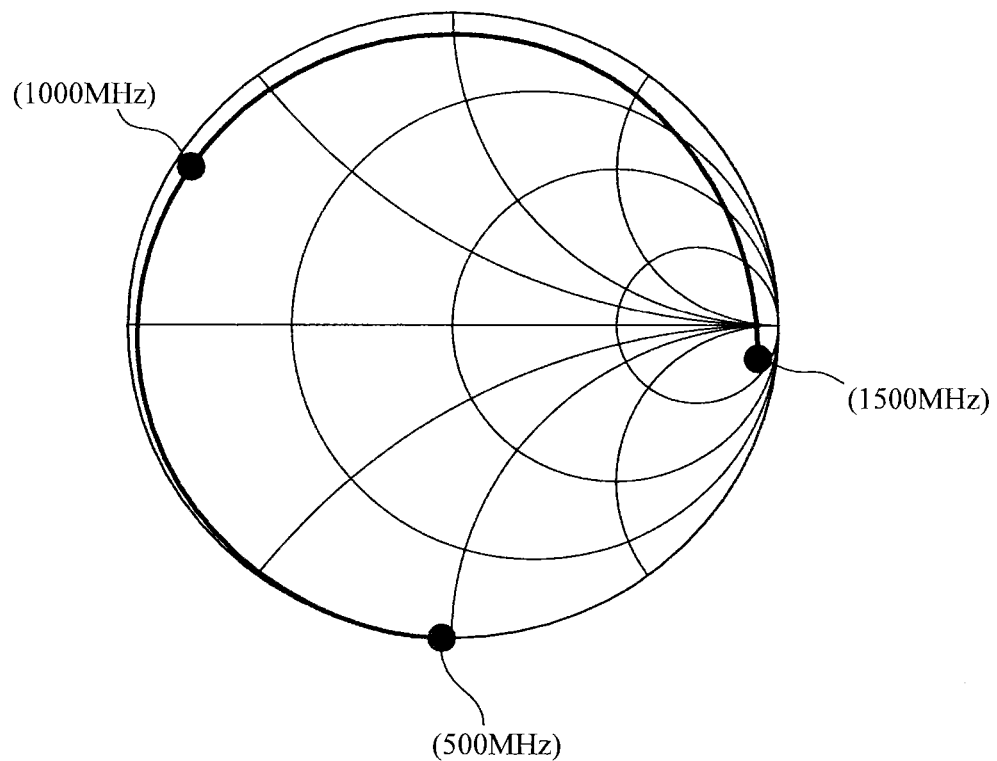
FIG. 5 is a characteristic diagram showing a simulation result of the computation model.

FIG. 4 is a cross-sectional view showing a computation model of the top-loading monopole antenna, and FIG. 5 is a characteristic diagram showing a simulation result thereof.

In FIG. 4 and FIG. 5, the following conception is illustrated: in a case where the diameter of the opening 4 and the inner diameter of the branch pipe 5 each are 70 mm, and where a length from the one surface of the cover member 8 to the inner surface of the structure 1 is 30 mm, setting the diameter of the disc 6 to 50 mm gives a series resonance when the specific frequency to be detected is set to 1000 MHz.

Accordingly, when the distance between the outer peripheral surface of the disc 6 and the inner surface of the structure 1 forming the opening 4 is adjusted, even when the specific frequency to be detected is set to 1000 MHz, the diameter of the disc 6 can be set to 50 mm, for example; thus, even when the branch pipe 5 is a diameter-narrowed pipe such that the inner diameter thereof is 70 mm, the top-loading monopole antenna serving as the partial discharge sensor can be installed within the branch pipe 5.

It is noted that the partial discharge sensor installed in the GIS is required to have a frequency band of 500 MHz to 1500 MHz as a frequency band to be detected.

In the configuration shown in FIG. 4, since the specific frequency to be detected is set to 1000 MHz of an intermediate frequency of the desired frequency band, it is possible to construct the partial discharge sensor exhibiting averagely high sensitivity over a desired frequency band.

As described above, according to Embodiment 1, the top-loading monopole antenna is configured by the disc 6 and the post 7.

Thus, it is possible to set thereto the frequency band to be detected without increasing the inner diameter of the branch pipe 5 in such a manner that the distance between the outer peripheral surface of the disc 6 and the inner surface of the structure 1 forming the opening 4 is adjusted; thus, the partial discharge sensor which can be installed even in the branch pipe 5 with a small diameter can be obtained.

Incidentally, in this case, since the branch pipe 5 is conventionally installed in the GIS and so on, there is no need of providing a new installation place for only installing the partial discharge sensor, and the installation of the partial discharge sensor can be carried out easily.

Further, according to Embodiment 1, since the top-loading monopole antenna has a shape that is axisymmetric about the central axis of the post 7, the sensitivity on the one surface of the disc 6 has no angular characteristics in an azimuth direction thereof.

Accordingly, the radio-frequency wave generated within the cylindrical structure 1 can be received at a fixed sensitivity in all the directions.

Further, according to Embodiment 1, a coaxial line is constituted by the cylindrical branch pipe 5, the post 7 connected to the disc 6, and the cover member 8 that has the opening 9 into which the post 7 is inserted and that is electrically connected with the structure 1 through the branch pipe 5.

Thus, it is possible to prevent a mixture by a radio-frequency noise coming from the outside of the branch pipe 5 at the time when the radio-frequency wave received by the disc 6 is transmitted as the radio-frequency signal to the outside through the post 7.

Furthermore, as described above, the branch pipe 5 is conventionally installed in the GIS or the like. The purposes thereof are as follows:

ensuring a space to place a desiccant since presence of moisture in the GIS degrades insulating performance thereof;

ensuring a hole for maintenance of the interior of the structure 1;

providing a peep window to monitor the interior; and arranging an explosion disc designed to explode when a pressure of a certain level or more is applied thereto, in order to prevent a main body of the GIS from being broken due to a pressure at the time when a discharge occurs inside the structure 1.

According to Embodiment 1, by virtue of the configuration in which the partial discharge sensor is provided in the branch pipe 5, the function of the partial discharge sensor of Embodiment 1 can be added to conventional functions with the singe branch pipe 5, thereby achieving multiple functions of the single branch pipe 5.

In this case, the necessity of providing a new branch pipe 5 for only the partial discharge sensor is eliminated, which can improve degree of freedom in design in relation to the branch pipe 5.

Incidentally, according to Embodiment 1, the configuration in which the post 7 is solely inserted into the opening 9 formed in the cover member 8 is shown; however, it may be configured that a gap between the post 7 and the opening 9 of the cover member 8 is filled with a resin member as in Embodiment 5 described later.

In this instance, the disc 6 and the post 7 can be held by the cover member 8.

Also, an insulating gas charged in the structure 1 can be prevented from leaking out to the outside.

Further, since a material thereof is dielectric, a function as a coaxial line can be maintained.

Embodiment 2

In Embodiment 2, it is configured that a post 7 is connected to a cover member 8 by a short stub to thus improve sensitivity thereof and prevent generation of a high voltage in a disc 6.

Figure 6:
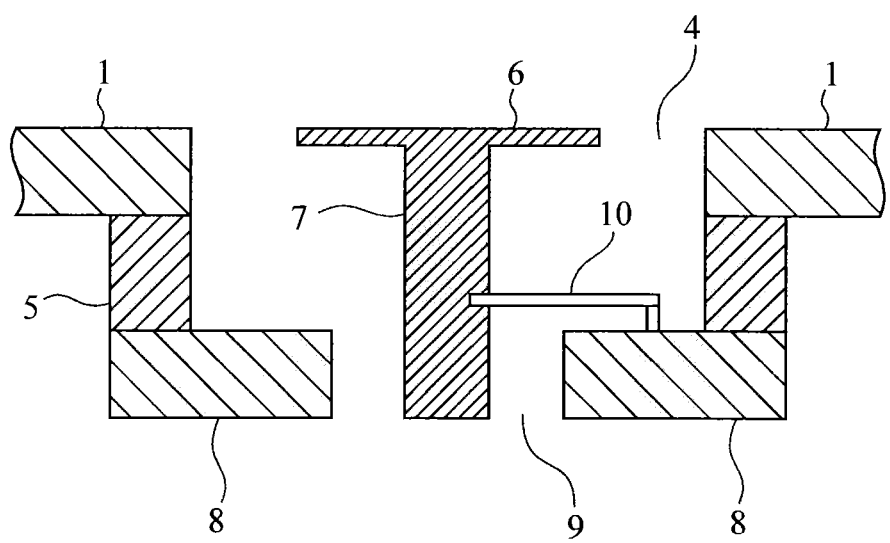
FIG. 6 is a cross-sectional view showing details of a partial discharge sensor according to Embodiment 2 of the invention.
Figure 7:
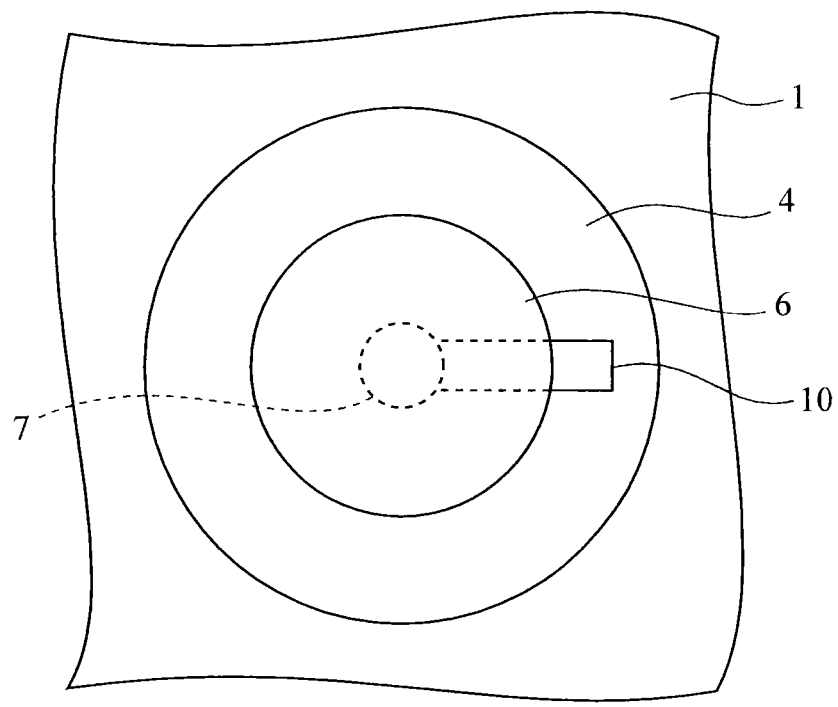
FIG. 7 is a top view showing details of the partial discharge sensor according to Embodiment 2 of the invention.

FIG. 6 is a cross-sectional view showing details of a partial discharge sensor according to Embodiment 2 of the invention, and FIG. 7 is a top view thereof.

In the drawings, a short stub (short-circuit plate) 10 has an electrical length of ¼ wavelength of a specific frequency included in a frequency band to be detected; one end of the stub is connected to the post 7 in the vicinity of the cover member 8, and the other end thereof is connected to the cover member 8.

The other components are the same as those of FIG. 1.

Next, an operation thereof will be described.

In the configuration shown in FIGS. 6 and 7, a top-loading monopole antenna by the disc 6 and post 7 is formed on the cover member 8 set to a ground potential.

The top-loading monopole antenna has a branch pipe 5 arranged in the vicinity thereof therearound and is also downsized, and thereby has a resistance lower than 35 Ω that is a resistance value of an ordinary monopole antenna at a resonance frequency.

Figure 8:
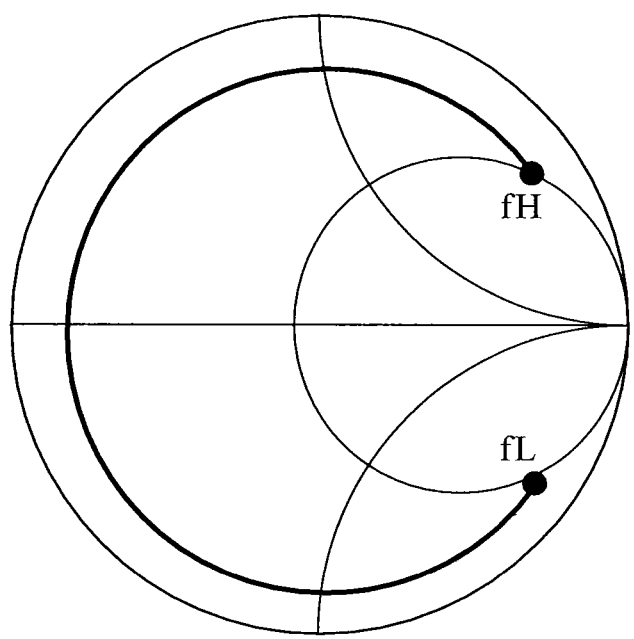
FIG. 8 is a characteristic diagram showing an impedance characteristic Za.

FIG. 8 is a Smith chart illustrating an impedance characteristic Za of the top-loading monopole antenna.

In FIG. 8, fL indicates a lower limit of a frequency band to be detected, and fH indicates an upper limit thereof.

Figure 9:
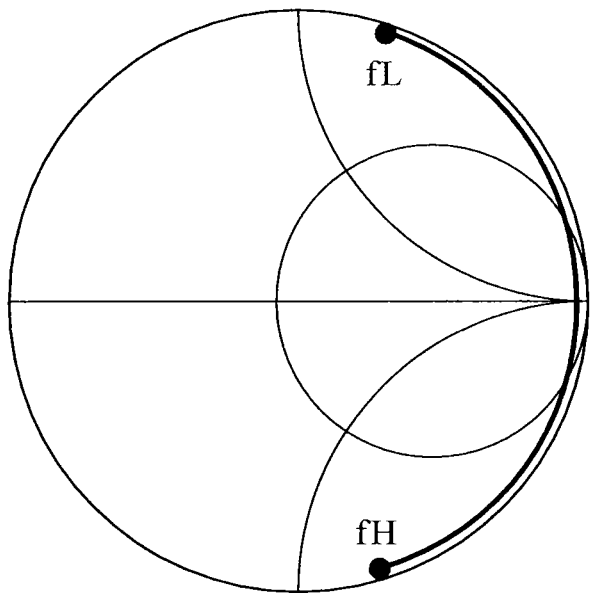
FIG. 9 is a characteristic diagram showing an impedance characteristic Zs of a short-circuit plate.

An impedance characteristic Zs of the short stub 10 as viewed from the post 7 with respect to the cover member 8 is illustrated in FIG. 9.

In FIG. 9, substantially infinite impedance is exhibited at a central frequency thereof, inductive one is shown at a frequency lower than the central frequency and capacitive one is shown at a frequency higher than that frequency.

In the configuration shown in FIG. 6, the short stub 10 is connected to a portion in the vicinity of a feeding point of the top-loading monopole antenna, that is, in the vicinity of the cover member 8; thus, when the impedance between the cover member 8 and the post 7 near the cover member 8 is denoted by Zt, Zt is found by parallel composition of Za and Zs as shown in the following equation (1).

$$Zt=Za*Zs/(Za+Zs) \quad (1)$$

Figure 10:
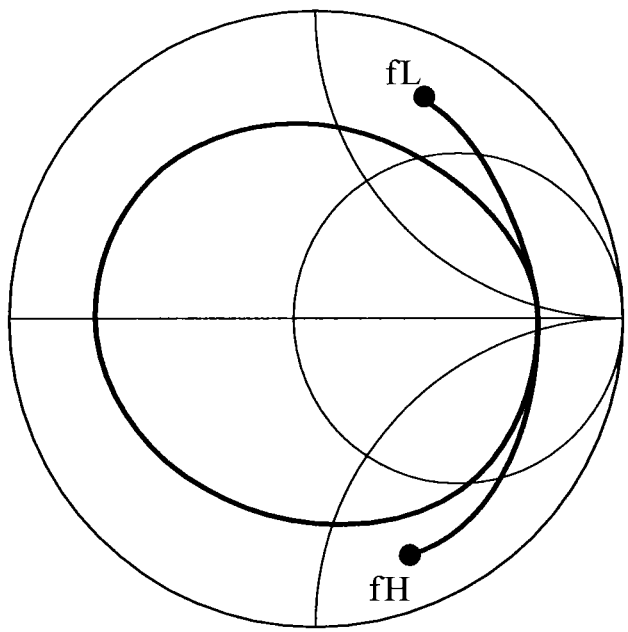
FIG. 10 is a characteristic diagram showing an impedance characteristic Zt.

The parallel-composed impedance characteristic Zt is illustrated in FIG. 10.

In FIG. 10, reactance components of Za and Zs tend to cancel out each other, and hence an impedance locus of Zt comes nearer to the center as compared with Za.

Thus, an average reflectance property within the frequency band to be detected are improved in comparison with Za, and hence a mismatching loss of impedance is reduced, thereby constructing the partial discharge sensor with a higher sensitivity on average over the frequency band to be detected in comparison with that of Embodiment 1.

On the other hand, stray capacitance is generated between the high voltage cable 2 and the disc 6, and when the disc 6 is insulated from the structure 1 and/or the cover member 8, a high voltage is induced in the disc 6.

The high voltage induced in the disc 6 may adversely affect a measuring device or the like of the partial discharge sensor.

In order to avoid this, conduction has only to be established between the disc 6 and the cover member 8 at a low frequency used for the high voltage cable 2. The low frequency used for the high voltage cable 2 is normally 50 Hz or 60 Hz, and hence the disc 6 and the cover member 8 are almost short-circuited at the low frequency by installation of the short stub 10. Therefore, it is possible to prevent the generation of a high voltage in the disc 6, and it is possible to avoid the adverse effect to the measuring device of the partial discharge sensor.

Accordingly, by means of the short stub 10, the following two advantageous effects can be obtained at the same time: enhancement of the sensitivity of the partial discharge sensor, and suppression of the generation of a high voltage.

According to Embodiment 2 as described above, there is provided with the short stub 10 having the electrical length of ¼ wavelength of the specific frequency within the frequency band to be detected, and connecting the cover member 8 to the post 7 in the vicinity of the cover member 8.

Thus, the impedance between the post 7 and the cover member 8 is approximated to infinity at the specific frequency, to be thus approximated to the short circuit at the low frequency used for the high voltage cable 2.

As a result, the impedance characteristic of the top-loading monopole antenna and the reactance component of the short stub 10 cancel out each other in such a manner that the impedance between the post 7 and the cover member 8 is approximated to infinity at the specific frequency, so that the reflectance property in the frequency band to be detected can be improved, and that the mismatching loss of impedance can be reduced; thus, the partial discharge sensor with high sensitivity can be obtained.

Further, when the impedance between the post 7 and the cover member 8 is approximated to the short circuit at the low frequency used for the high voltage cable 2, the generation of a high voltage in the disc 6 can be prevented and possible adverse effects to the measuring device can be avoided.

Incidentally, although in Embodiment 2 described above, the configuration to be connected by the short stub 10 is shown, a configuration to be connected by a short-circuit line in place of the short stub 10 may also be employed.

Specifically, there is provided with the short-circuit line having the electrical length of ¼ wavelength of the specific frequency in the frequency band to be detected, and connecting the post 7 in the vicinity of the cover member 8 to the cover member 8.

Figure 11:
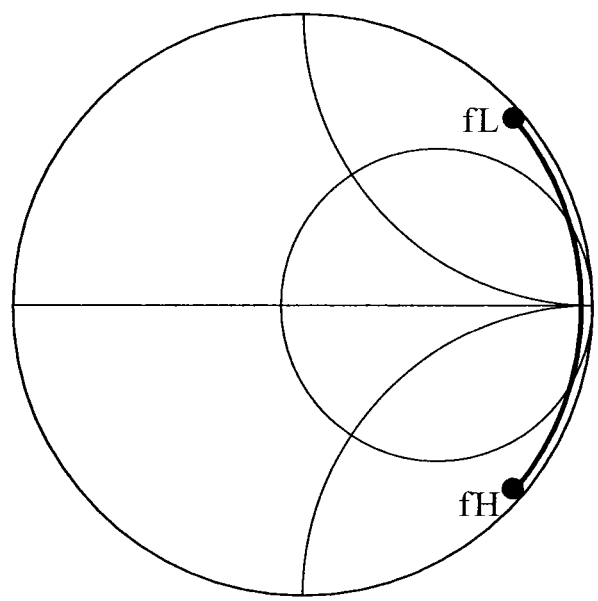
FIG. 11 is a characteristic diagram showing an impedance characteristic Zs of a short-circuit line.

Although the impedance characteristic Zs of the short stub 10 as viewed from the post 7 with respect to the cover member 8 is illustrated in FIG. 9, the impedance characteristic Zs of the short-circuit line as viewed from the post 7 with respect to the cover member 8 is illustrated in FIG. 11.

As seen from a comparison between FIG. 9 and FIG. 11, the impedance characteristics is changed in the short stub 10, namely between the short-circuit plate and the short-circuit line.

Relatively, the lower limit fL and the upper limit fH of the frequency band to be detected tend to approach to each other in the short-circuit line, whereas they tend to go away from each other in the short-circuit plate.

Since optimal positions of the lower limit fL and the upper limit fH of the impedance characteristic Zs differ depending on the impedance characteristic Za of the top-loading monopole actually configured (FIG. 8), there arises a need to adjust the impedance characteristic Zs.

As one example thereof, when the short-circuit plate and the short-circuit line is used properly, a desired impedance characteristic Zs is obtained and the reflectance property can be improved effectively.

Embodiment 3

In Embodiment 3, it is configured that when a cover member 8 is provided with a ring-shaped projection member, even in a case where a branch pipe 5 is long, a top-loading monopole antenna can be installed therein.

Figure 12:
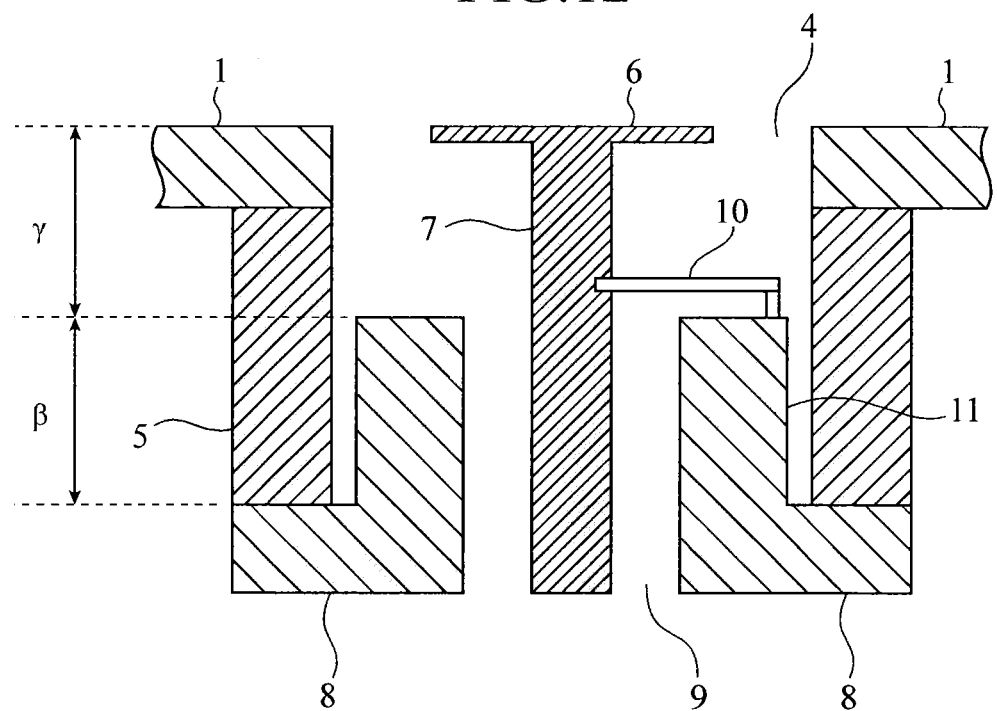
FIG. 12 is a cross-sectional view showing details of a partial discharge sensor according to Embodiment 3 of the invention.

FIG. 12 is a cross-sectional view showing details of a partial discharge sensor according to Embodiment 3 of the invention.

In the drawing, a projection member 11 is formed in a ring shape on one surface of the cover member 8 in the interior of the branch pipe 5.

The ring-shaped projection member 11 has a height 1 corresponding to an upper end face thereof in which a length from an inner surface of the structure 1 to one surface of the cover member 8 is subtracted by a predetermined length γ, and also has the same inner diameter as a diameter of an opening 9 of the cover member 8; the opening 9 is formed to extend to the upper end face of the ring-shaped projection member 11; further, the ring-shaped projection member 11 has an outer diameter to be contained within the branch pipe 5, that is, formed to have a smaller outer diameter than an inner diameter of the branch pipe 5, and is arranged such that an inner surface of the branch pipe 5 faces an outer surface of the ring-shaped projection member 11.

In this connection, one end of the short stub 10 is connected to a side face of a post 7, and the other end thereof is connected to a portion in the vicinity of the upper end of the projection member 11; however, the side face of the post 7 is connected at a position separated from the inner surface of the structure 1 by a predetermined length γ, that is, in the vicinity of a position separated from one surface of the disc 6 by the predetermined length γ.

The other components are the same as those of FIG. 6.

Next, an operation thereof will be described.

Figure 13:
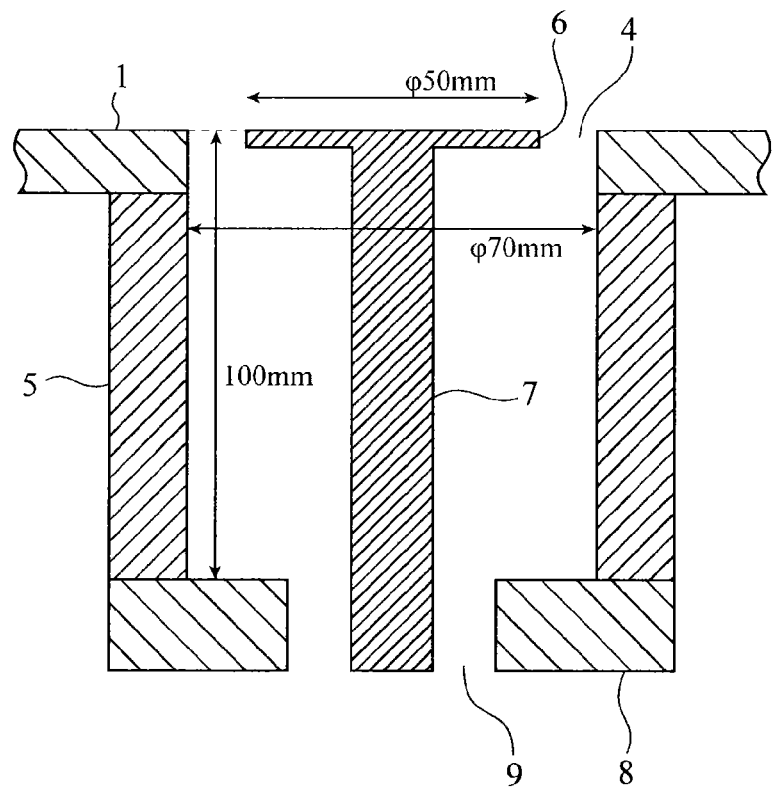
FIG. 13 is a cross-sectional view showing details of the partial discharge sensor when the invention shown in Embodiment 1 is directly applied when the branch pipe is long.

FIG. 13 is a diagram which the invention shown in Embodiment 1 above is directly applied when a length of the branch pipe 5 is long.

In FIG. 13, when a diameter of an opening 4 provided in the structure 1 is smaller than about a half wavelength of a lower limit frequency of a frequency band to be detected, an interior of the branch pipe 5 operates as a cutoff waveguide. Therefore, a radio-frequency wave generated in a closed space 3 is rapidly attenuated within the branch pipe 5.

Therefore, even when the length of the branch pipe 5 is long, the one surface of the disc 6 must be arranged as close as possible to the inner surface of the structure 1 as in Embodiment 1 and Embodiment 2 described above.

Also, a part operating as a partial discharge sensor is a top-loading monopole antenna composed of the disc 6 and post 7 formed on the cover member 8 set to a ground potential, and for a length of that part, there exists an optimal length in order to improve sensitivity of the partial discharge sensor.

In FIG. 4 in the above, the following conception is described: in a case where the diameter of the opening 4 and the inner diameter of the branch pipe 5 are set to 70 mm, the length from the one surface of the cover member 8 to the inner surface of the structure 1 is set to 30 mm, and the diameter of the disc 6 is set to 50 mm, sensitivity of the partial discharge sensor can be improved when a specific frequency to be detected is set to 1000 MHz.

The branch pipe 5 shown in FIG. 13 has a longer length than the branch pipe 5 shown in FIG. 4, and the length from the one surface of the cover member 8 to the inner surface of the structure 1 is 100 mm, and therefore, the sensitivity of the partial discharge sensor is degraded.

The configuration shown in FIG. 12 corresponds to a case in which the length of the branch pipe 5 is long as mentioned above. The provision of the ring-shaped projection member 11 on the one surface of the cover member 8 makes it possible to optimally adjust the length of top-loading monopole antenna by the disc 6 and the post 7 formed on the projection member 11 set to the ground potential.

Figure 14:
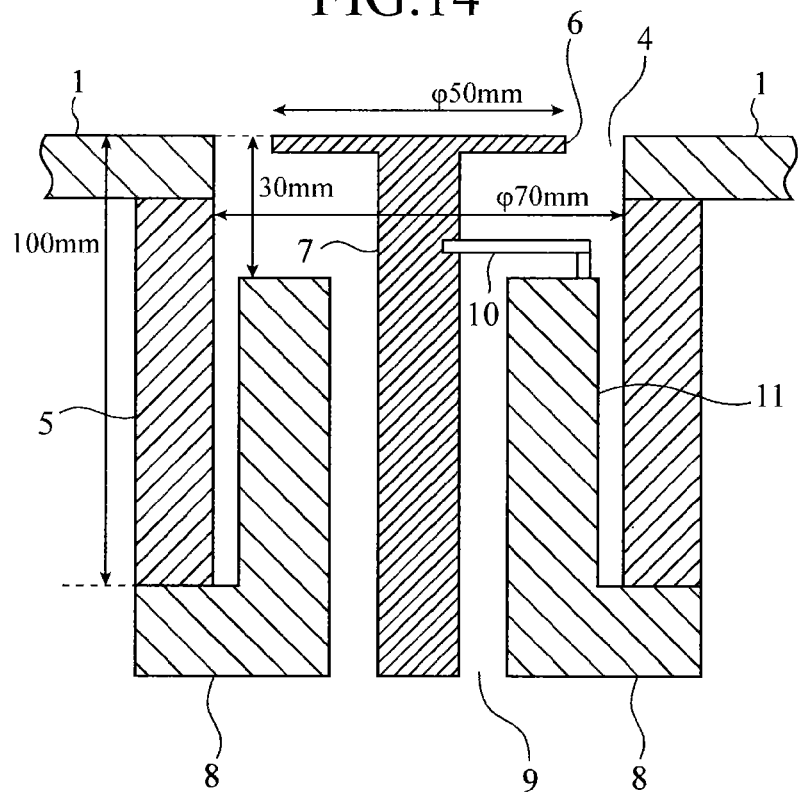
FIG. 14 is a cross-sectional view showing details of the partial discharge sensor when the invention shown in Embodiment 3 is applied when the branch pipe is long.

In FIG. 14, with respect to a configuration in which a length from one surface of a cover member 8 to an inner surface of a structure 1 is 100 mm, similarly that of FIG. 4, there is provided with a projection member 11 having such a height that is 30 mm from an upper end face thereof to an inner surface of the structure 1.

With such a configuration, the sensitivity of the partial discharge sensor can be enhanced when the specific frequency to be detected is 1000 MHz.

Additionally, similarly to that in Embodiment 2 described above, the short stub 10 approximates the impedance between the post 7 and the projection member 11 to infinity at the specific frequency, and further approximates the impedance to a short circuit at a low frequency used for the high voltage cable 2, and therefore the same effects as those of Embodiment 2 can be obtained.

As described above, according to Embodiment 3, there is provided with the ring-shaped projection member 11 which is arranged in the interior of the branch pipe 5, which is formed to the upper end face thereof in which the length from the inner surface of the structure 1 to the one surface of the cover member 8 is subtracted by a predetermined length, and of which an opening having the same diameter as that of the opening 9 of the cover member 8 is formed to be extended up to the upper end face thereof.

Thus, an optimal sensitivity thereof can be obtained even when the length of the branch pipe 5 is long.

According to Embodiment 3, a coaxial line is formed by the post 7 and the cover member 8 having the projection member 11.

Thus, that coaxial line has a longer length than the coaxial line formed by the post 7 and the cover member 8 shown in Embodiment 1 and Embodiment 2 described above.

Accordingly, when the coaxial line formed by the post 7 and the cover member 8 having the projection member 11 is designed such that an input impedance of an external measuring device (normally 50 Ω) is a characteristic impedance, the characteristics of the top-loading monopole can be prevented from being affected by the extended line length.

Embodiment 4

In Embodiment 4, it is configured to prevent degradation of sensitivity of a partial discharge sensor by connecting a portion in the vicinity of an upper end of a projection member 11 to an opposing inner surface of a branch pipe 5 by means of a spring member.

Figure 15:
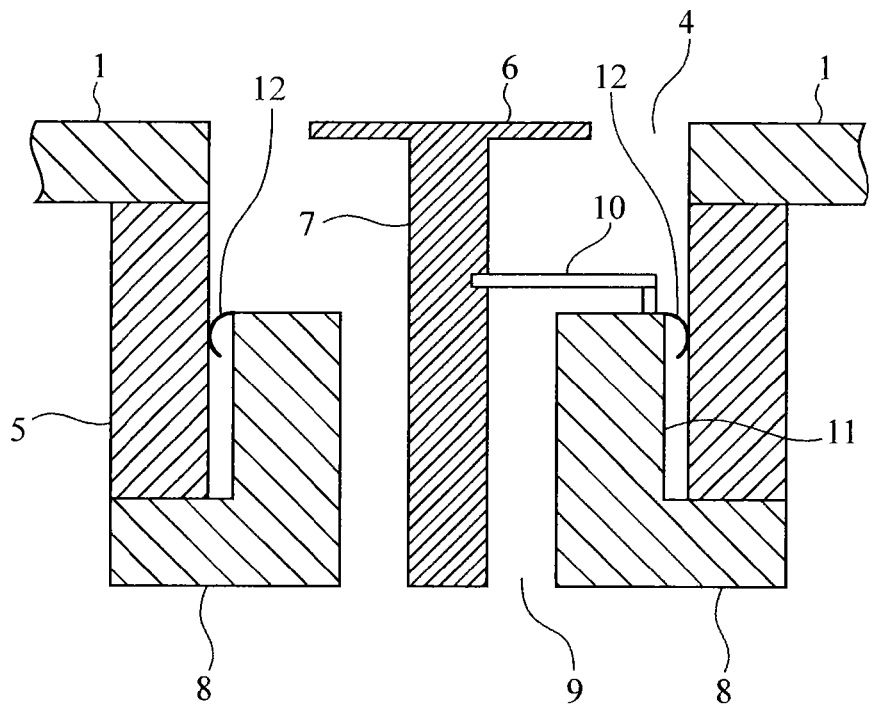
FIG. 15 is a cross-sectional view showing details of a partial discharge sensor according to Embodiment 4 of the invention.

FIG. 15 is a cross-sectional view showing details of the partial discharge sensor according to Embodiment 4 of the invention.

In the drawing, a spring member (short-circuit member) 12 connects a portion in the vicinity of the upper end of the projection member 11 to the opposing inner surface of the branch pipe 5.

The other components are the same as those of FIG. 12.

Next, an operation thereof will be described.

In the configuration described in Embodiment 3, a significant degradation of the sensitivity of the partial discharge sensor is caused in the vicinity of a specific frequency at which the height of the projection member 11 is $\lambda$ (¼+n/2), (where n is an integer of 0 or more). Such a reason will be described below.

At the above specific frequency, the impedance between the upper end of the projection member 11 and the cover member 8 assumes a parallel resonance state and theoretically becomes infinite. As a result, a current between the upper end of the projection member 11 and the structure 1 is cut off, and therefore the significant degradation of the sensitivity of the partial discharge sensor is caused.

In order to prevent this, the portion in the vicinity of the upper end of the projection member 11 is connected to the opposing inner surface of the branch pipe 5 by means of the spring member 12. As a result, the current is allowed to flow between the upper end of the projection member 11 and the structure 1 without occurrence of the parallel resonance at the above specific frequency, and the significant degradation of the sensitivity of the partial discharge sensor can be prevented.

As described above, according to Embodiment 4, there is provided with the spring member 12 that connects the portion in the vicinity of the upper end of the projection member 11 and the opposing inner surface of the branch pipe 5, and therefore the significant degradation of the sensitivity of the partial discharge sensor can be prevented even when a received frequency is the specific frequency related to the height of the projection member 11.

Incidentally, according to Embodiment 4 described above, although the spring member 12 is provided, any other construction can be employed as long as it is electrically conductive.

Embodiment 5

In Embodiment 5, it is configured that a gap between a post 7 and an opening 9 of a cover member 8 is filled with a resin member, to thus hold a disc 6 and the post 7 and to prevent leakage of an insulating gas.

Figure 16:
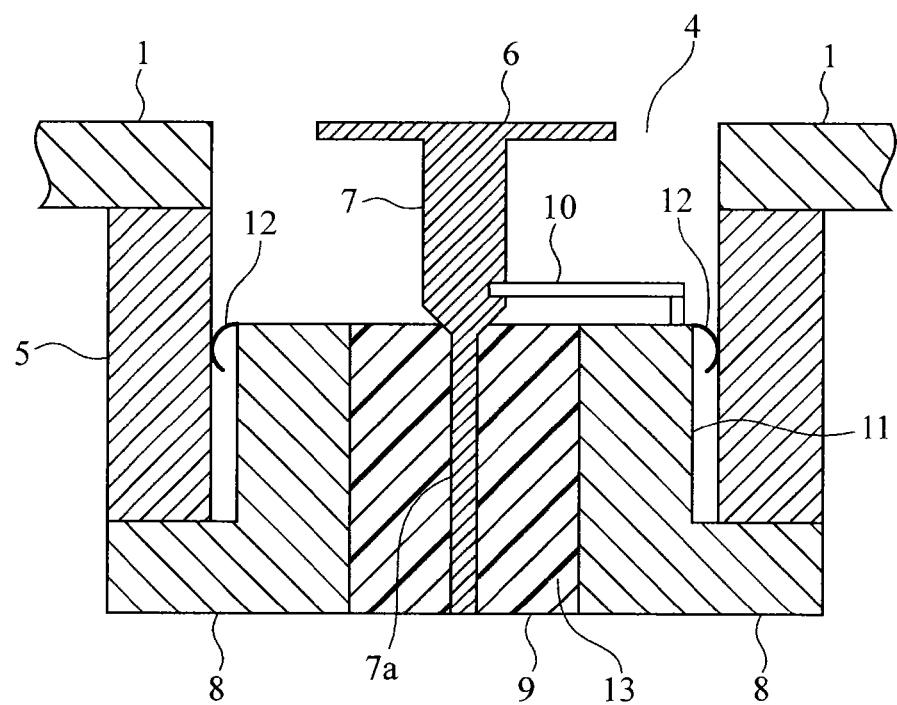
FIG. 16 is a cross-sectional view showing details of a partial discharge sensor according to Embodiment 5 of the invention.

FIG. 16 is a cross-sectional view showing details of a partial discharge sensor according to Embodiment 5 of the invention.

In the drawing, a resin member (dielectric member) 13 is made of a material such as an epoxy resin, and is filled in the gap between the opening 9 and post 7 inserted into the opening 9 of the cover member 8 and projection member 11.

Additionally, a part of the post 7 that is inserted into the opening 9 is provided with a reduced diameter portion 7a with a diameter smaller than the other part.

The other components are the same as those of FIG. 15.

As described above, according to Embodiment 5, the gap between the opening 9 of the cover member 8 and the projection 11 and the post 7 inserted into the opening 9 is filled with the resin member 13, and therefore a top-loading monopole antenna composed of the disc 6 and the post 7 can be physically held by the cover member 8 and projection 11.

Further, according to Embodiment 5, the gap between the post 7 and opening 9 can be filled with the resin member 13, and therefore the leakage of the insulating gas in the structure 1 to the external can be prevented.

Furthermore, according to Embodiment 5, the resin member 13 of the epoxy resin has a relative dielectric constant of the order of 4.

As a result, a coaxial line constituted by the post 7, resin member 13, t cover member 8 and projection 11 has a characteristic impedance lower than 50 Ω generally used in radio frequency.

In order to prevent this, a reduced diameter portion 7a is provided in a part of the post 7 which is inserted into the opening 9 and is filled with the resin member 13. The provision of the reduced diameter portion 7a increases the impedance in comparison with a case where the reduced diameter portion 7a is not provided, and hence the lowering of characteristic impedance due to the filling with the resin member 13 can be canceled out and the characteristic impedance of the coaxial line can be maintained at a desired value (50 Ω).

Embodiment 6

In Embodiment 6, it is configured that when a coaxial line is connected to a post 7 and a connecting portion is covered with a shielding cover to prevent effects of external noise.

Figure 17:
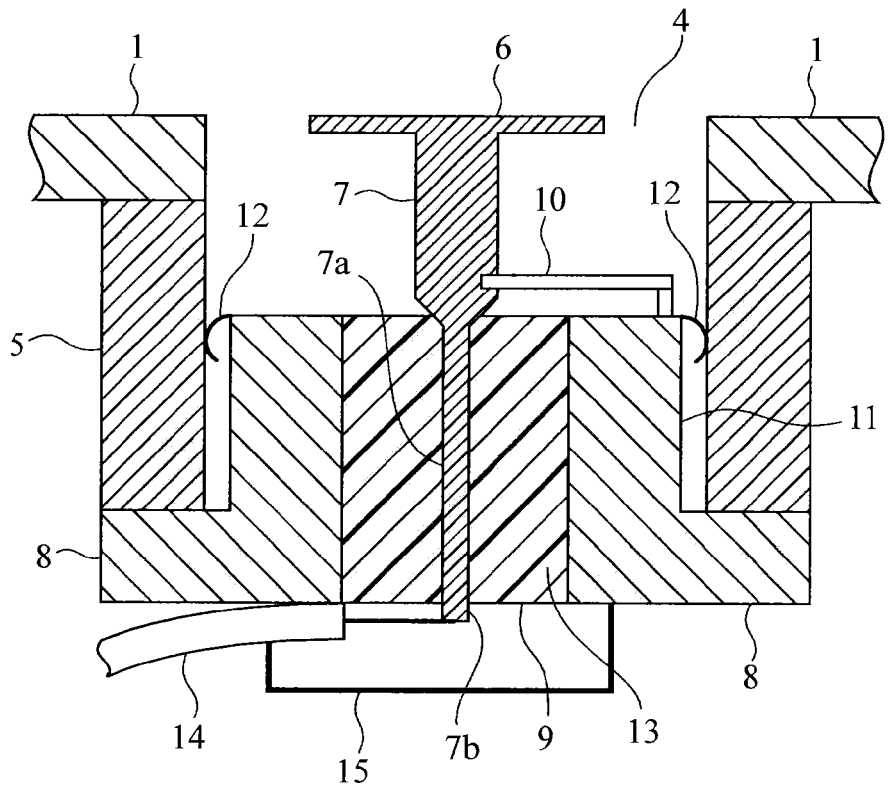
FIG. 17 is a cross-sectional view showing details of a partial discharge sensor according to Embodiment 6 of the invention.

FIG. 17 is a cross-sectional view showing details of a partial discharge sensor according to Embodiment 6 of the invention.

In the drawing, the post 7 is provided with a projection 7b formed to project from a resin member 13.

An inner conductor of a coaxial line 14 is connected to the projection 7b, and also an outer conductor thereof is connected to the other surface of a cover member 8 in the vicinity of an opening 9.

Also, the shielding cover (noise shielding member) 15 is installed to the other surface of the cover member 8, and is installed to cover the connecting portions of the inner conductor and the outer conductor of the coaxial line 14.

The other components are the same as those of FIG. 16.

Next, an operation thereof will be described.

In FIG. 17, a radio-frequency signal received by a partial discharge sensor is transmitted to a measuring device through the coaxial line 14.

The connecting portion between the coaxial line 14 and the projection 7b of the post 7 is apt to receive external noise.

In order to prevent this, the connecting portion is covered with a shielding cover 15 placed at a ground potential. Consequently, the radio-frequency signal received by the partial discharge sensor can be transmitted to the measuring device without being affected by external noise.

As described above, according to Embodiment 6, there is provided with the coaxial line 14 in which the inner conductor is connected to the projection 7b, and the outer conductor is connected to the other surface of the cover member 8 in the vicinity of the opening 9, and the shielding cover 15 connected to the other surface of the cover member 8, and placed to cover the connecting portions of the inner conductor and outer conductor of the coaxial line 14.

Thus, the detected radio-frequency signal can be transmitted to the measuring device through the coaxial line 14 without the connecting portion of the coaxial line 14 being affected by external noise.

Embodiment 7

In Embodiment 7, it is configured that when a strip line is connected to a post 7 and the connecting portion is covered with a shielding cover to thus prevent effects of external noise.

Figure 18:
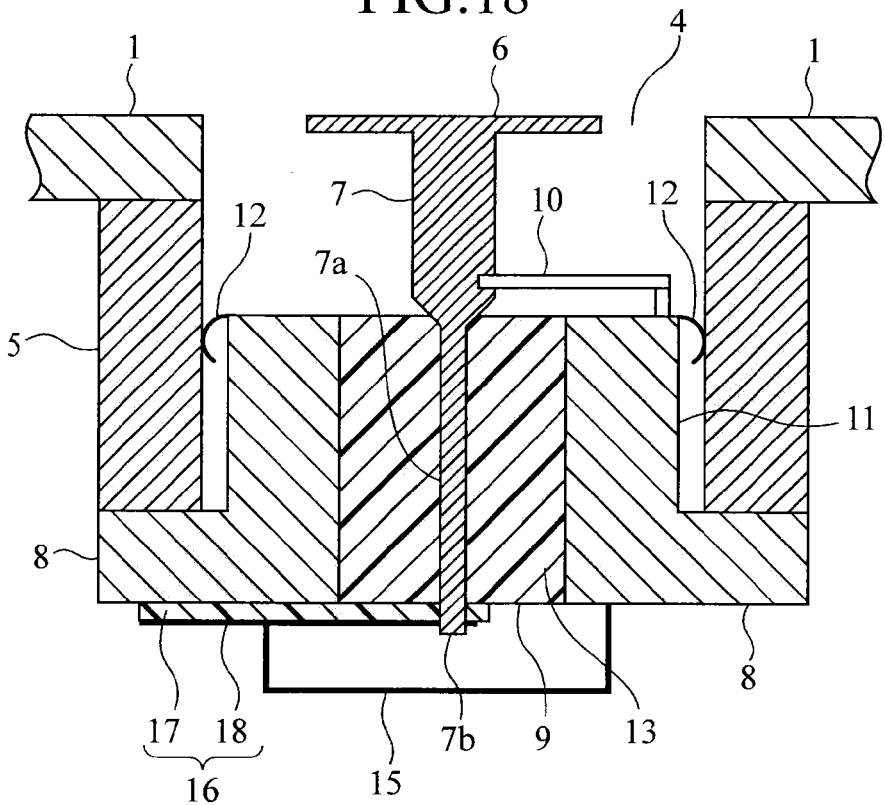
FIG. 18 is a cross-sectional view showing details of a partial discharge sensor according to Embodiment 7 of the invention.
Figure 19:
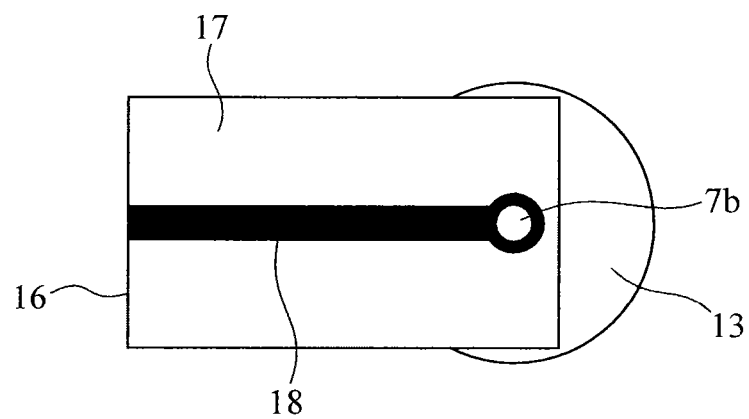
FIG. 19 is a bottom view showing details of the partial discharge sensor according to Embodiment 7 of the invention.

FIG. 18 is a cross-sectional view showing details of a partial discharge sensor according to Embodiment 7 of the invention, and FIG. 19 is a bottom view thereof.

In the drawings, for a strip line 16 provided in place of the coaxial line 14, a dielectric substrate 17 is arranged in close contact with the other surface of a cover member 8 to cause the cover member 8 to serve as a ground conductor, and a strip conductor 18 formed on the dielectric substrate 17 is connected to a projection 7b of the post 7.

Also, a shielding cover (noise shielding member) 15 is connected to the other surface of the cover member 8 and arranged to cover the connecting portion of the strip conductor 16.

The other components are the same as those of FIG. 17.

Next, an operation thereof will be described.

In FIG. 18 and FIG. 19, a radio-frequency signal received by a partial discharge sensor is transmitted to a measuring device through the strip line 16.

The connecting portion between the strip conductor 18 of the strip line 16 and the projection 7b of the post 7 is apt to receive external noise.

In order to prevent this, the connecting portion is covered with the shielding cover 15 placed at a ground potential. As a result, the radio-frequency signal received by the partial discharge sensor can be transmitted to the measuring device without being affected by external noise.

As described above, according to Embodiment 7, the dielectric substrate 17 is arranged in close contact with the other surface of the cover member 8 to cause the cover member 8 to serve as the ground conductor, and there is provided to include: the strip line 16 connecting the strip conductor 18 formed on the dielectric substrate 17 to the projection 7b of the post 7; and the shielding cover 15 connected to the other surface of the cover member 8 and arranged to cover the connecting portion of the strip conductor 16.

Thus, the detected radio-frequency signal can be transmitted to the measuring device through the coaxial line 14 without the connecting portion of the strip conductor 18 of the strip line 16 being affected by external noise.

Incidentally, according to Embodiment 7 described above, although shown is the configuration in which the signal is transmitted to the measuring device through only the strip line 16, the signal may be transmitted to the measuring device such that the strip line 16 is connected to the coaxial line at a midway point thereof.

Further, the invention can be modified or changed within the scope of the invention by combining the embodiments described above, altering arbitrary components or elements of the embodiments, or omitting arbitrary components of elements of the embodiments.

INDUSTRIAL APPLICABILITY

As described above, the partial discharge sensor according to the invention is configured to include: the disc arranged in the interior of the branch pipe, and arranged such that the one surface thereof is substantially flush with the inner surface of the structure; the post connected to the other surface of the disc; and the cover member having the opening to be inserted into by the post at the center thereof, arranged to close the other end of the branch pipe, and electrically connected with the structure through the branch pipe, and hence it is suitable for use in a high-power equipment such as GIS.

EXPLANATION OF REFERENCE NUMERALS

1 structure, 2 high voltage cable, 3 closed space, 4, 9 opening, 5 branch pipe, 6 disc, 7 post, 7a reduced diameter portion, 7b projection, 8 cover member, 10 short stub, 11 projection member, 12 spring member, 13 resin member, 14 coaxial line, 15 shielding cover, 16 strip line, 17 dielectric substrate, 18 strip conductor.

The invention claimed is:

1. A partial discharge sensor comprising:
   a cylindrical structure which is formed to surround a high voltage cable and of which a surface is set to a ground potential;
   a cylindrical branch pipe of which one end is connected to the structure;
   a disc which is arranged in an interior of the branch pipe and of which one surface is arranged to be substantially flush with an inner surface of the structure;
   a post connected to the other surface of the disc;
   a cover member which has an opening to be inserted into by the post at a center thereof, and of which one surface is arranged to cover the other end of the branch pipe to be thus electrically connected with the structure through the branch pipe; and
   a short-circuit plate having an electrical length of ¼ wavelength of a specific frequency included in a frequency band to be detected, the short-circuit plate connecting the cover member with a portion of the post in a vicinity of the cover member,
   wherein the cover member comprises a ring-shaped projection member which is arranged in the interior of the branch pipe, which is formed to an upper end thee thereof in which a length from the inner surface of the structure to one surface of the cover member is subtracted by a predetermined length, and of which an opening having the same diameter as that of the opening of the cover member is formed to be extended up to the upper end face thereof.

2. The partial discharge sensor according to claim 1, further comprising a short-circuit member for connecting a portion in the vicinity of an upper end of the projection member to an inner surface of the branch pipe.

3. A partial discharge sensor comprising:
   a cylindrical structure which is formed to surround a high voltage cable and of which a surface is set to a ground potential;
   a cylindrical branch pipe of which one end is connected to the structure;
   a disc which is arranged in an interior of the branch pipe and of which one surface is arranged to be substantially flush with an inner surface of the structure;
   a post connected to the other surface of the disc;
   a cover member which has an opening to be inserted into by the post at a center thereof, and of which one surface is arranged to cover the other end of the branch pipe to be thus electrically connected with the structure through the branch pipe;
   a short-circuit plate having an electrical length of ¼ wavelength of a specific frequency included in a frequency band to be detected, the short-circuit plate connecting the cover member with a portion of the post in a vicinity of the cover member;
   a dielectric member filled in a gap between the post and the opening of the cover member;
   a strip line having a dielectric substrate arranged in close contact with the other surface of the cover member to cause the cover member to serve as a ground conductor, and a strip conductor formed on the dielectric substrate and connected to the post passing through the opening of the cover member; and
   a noise shielding member set to the same potential as that of the other surface of the cover member, and covering a connecting portion of the strip conductor.

* * * * *